(12) United States Patent
Lin

(10) Patent No.: US 7,335,036 B1
(45) Date of Patent: Feb. 26, 2008

(54) MEMORY CARD READER

(75) Inventor: Le-Yao Lin, Taipei Hsien (TW)

(73) Assignee: Tai Twun Enterprise Co., Ltd., Taipei Hsien (TW)

( * ) Notice: Subject to any disclaimer, the term of this patent is extended or adjusted under 35 U.S.C. 154(b) by 0 days.

(21) Appl. No.: 11/702,457

(22) Filed: Feb. 5, 2007

(30) Foreign Application Priority Data

Nov. 3, 2006 (TW) .............................. 95219398 U

(51) Int. Cl.
*H01R 13/44* (2006.01)
(52) U.S. Cl. ....................................... 439/131; 439/946
(58) Field of Classification Search ................ 439/638, 439/76.1, 945, 946, 630
See application file for complete search history.

(56) References Cited

U.S. PATENT DOCUMENTS 6,435,409 B1 * 8/2002 Hu .............................. 235/441
6,547,603 B1 * 4/2003 Yu .............................. 439/638
2004/0087313 A1 * 5/2004 Reid ........................... 455/455
2004/0235354 A1 * 11/2004 Takahashi .................... 439/630
2005/0020139 A1 * 1/2005 Hagiwara .................... 439/638

* cited by examiner

*Primary Examiner*—James Harvey
*Assistant Examiner*—Travis Chambers
(74) *Attorney, Agent, or Firm*—Alan Kamrath; Kamrath & Associates PA

(57) ABSTRACT

A memory card reader includes a case including a first end with a compartment for coupling with a coupling opening of a USB socket. The case further includes a second end with a card receiving space. The card receiving space includes an insertion opening for receiving a memory card. An adaptor circuit board is mounted in the compartment and the card receiving space. The adaptor circuit board includes a first end with a USB interface and a second end with resilient conductive plates. The USB interface of the adaptor circuit board faces the compartment and is engaged with a coupling seat in the coupling opening of the USB socket and in contact with resilient conductive plates in the coupling seat. The resilient conductive plates of the adaptor circuit board face the card receiving space and are in contact with a read/write interface of the memory card.

5 Claims, 8 Drawing Sheets

MEMORY CARD READER

BACKGROUND OF THE INVENTION

1. Field of the Invention

The present invention relates to a memory card reader. More particularly, the present invention relates to a memory card reader that can couple with a USB socket and a memory card.

2. Description of the Related Art

Electronic cards are widely used in computers and electronic dictionaries for expanding memories, network cards, modems, and small computer system interfaces (SCSI) such as high-capacity hard disks, scanners, etc. In addition to personal computer memory card international association (PCMCIA) cards, electronic cards include multi-media cards (MMC), compact flash cards (CF), smart media cards (SMC), memory sticks (MS), secure digital memory cards (SD) for use in personal digital assistants (PDA), portable electronic dictionaries, digital cameras, etc.

However, most memory cards have an interface of a specific specification and, thus, cannot be used with the connection interface of widely used USB (universal serial bus) specification. More specifically, when a memory card with a single interface is to be connected to a USB interface of a computer, the connection must be made through use of an adaptor module of a reader and a USB socket so as to allow read/write operations of the memory card. However, conventional readers are complicated in assembly and processing and standard USB sockets are required. If the adaptor module of the reader is directly coupled to the USB socket via a USB interface, reliable electrical contact between contacts cannot be obtained.

SUMMARY OF THE INVENTION

A memory card reader in accordance with the present invention includes a case including a first end having a coupler with a compartment. The first end of the case is adapted to couple with a coupling opening of a USB socket. The case further includes a second end with a card receiving space in communication with the compartment. The card receiving space includes an insertion opening and is adapted for receiving a memory card through the insertion opening. An adaptor circuit board is mounted in the compartment and the card receiving space. The adaptor circuit board includes a side having a first end with a USB interface and a second end with a plurality of resilient conductive plates. The USB interface of the adaptor circuit board faces the compartment of the coupler and is adapted to engage with a coupling seat in the coupling opening of the USB socket and in contact with a plurality of resilient conductive plates in the coupling seat. The resilient conductive plates of the adaptor circuit board face the card receiving space and are adapted to be in contact with a read/write interface of the memory card.

Preferably, the compartment includes an extension groove extending into a lower portion of the card receiving space. The case includes a stepped portion defining an end of the extension groove. The adaptor circuit board is mounted in the compartment and the extension groove.

Preferably, the case further includes a stop wall between the compartment and the card receiving space. An inner end of the memory card abuts against and is retained in place by the stop wall when the memory card is inserted into the card receiving space.

Preferably, the adaptor circuit board includes a housing on an end thereof. One of the housing and the case includes at least one positioning protrusion. The other one of the housing and the case includes at least one positioning hole for engaging with the positioning protrusion.

Preferably, the adaptor circuit board further includes an insulating board on a side thereof. The insulating board isolates the resilient conductive plates from one another while allowing the resilient conductive plates to extend beyond the adaptor circuit board.

Other objectives, advantages, and features of the invention will become more apparent from the following detailed description when taken in conjunction with the accompanying drawings.

DETAILED DESCRIPTION OF THE PREFERRED EMBODIMENTS

Figure 1:
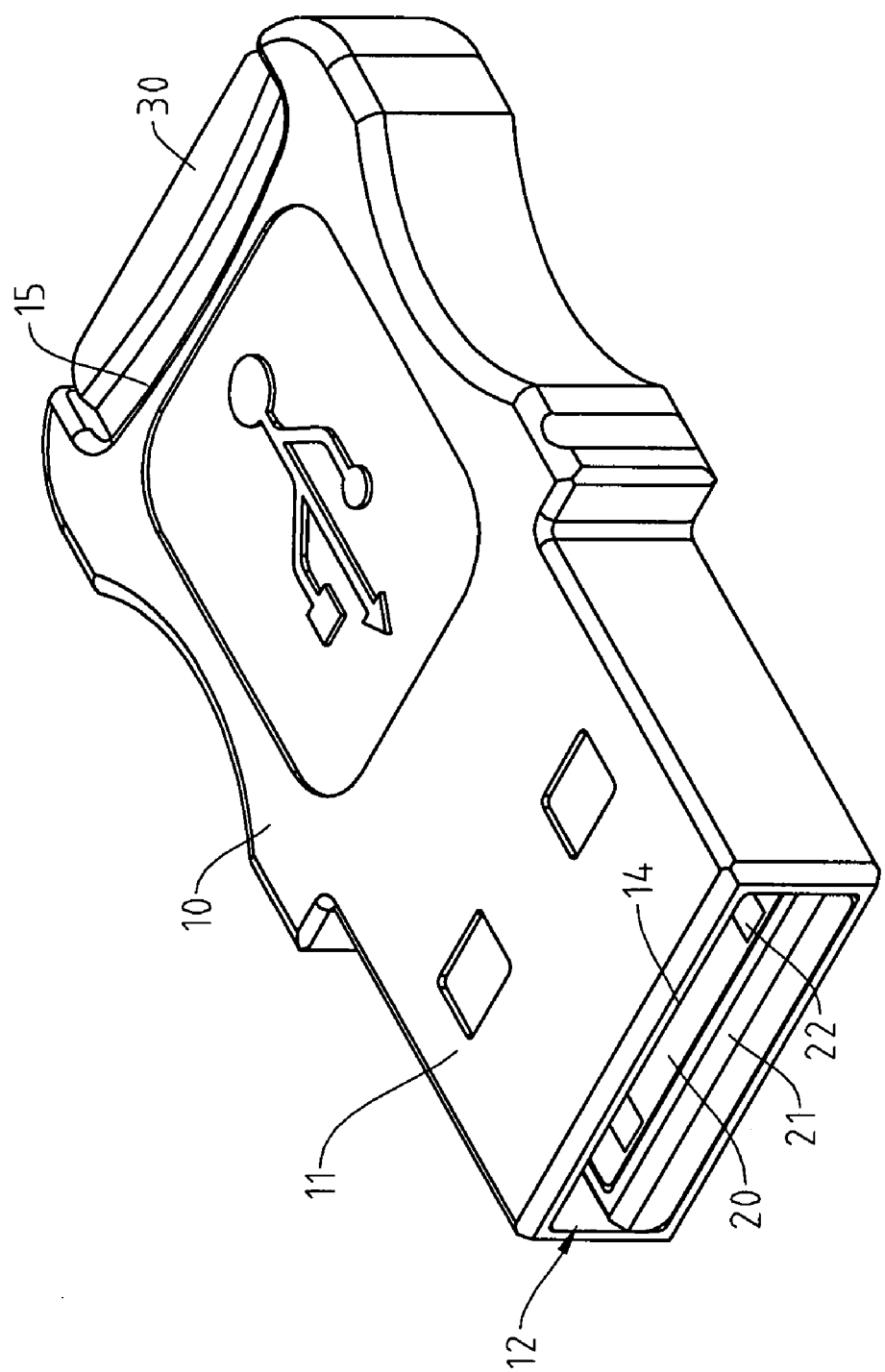
FIG. 1 is perspective view of a memory card and a memory card reader in accordance with the present invention.
Figure 2:
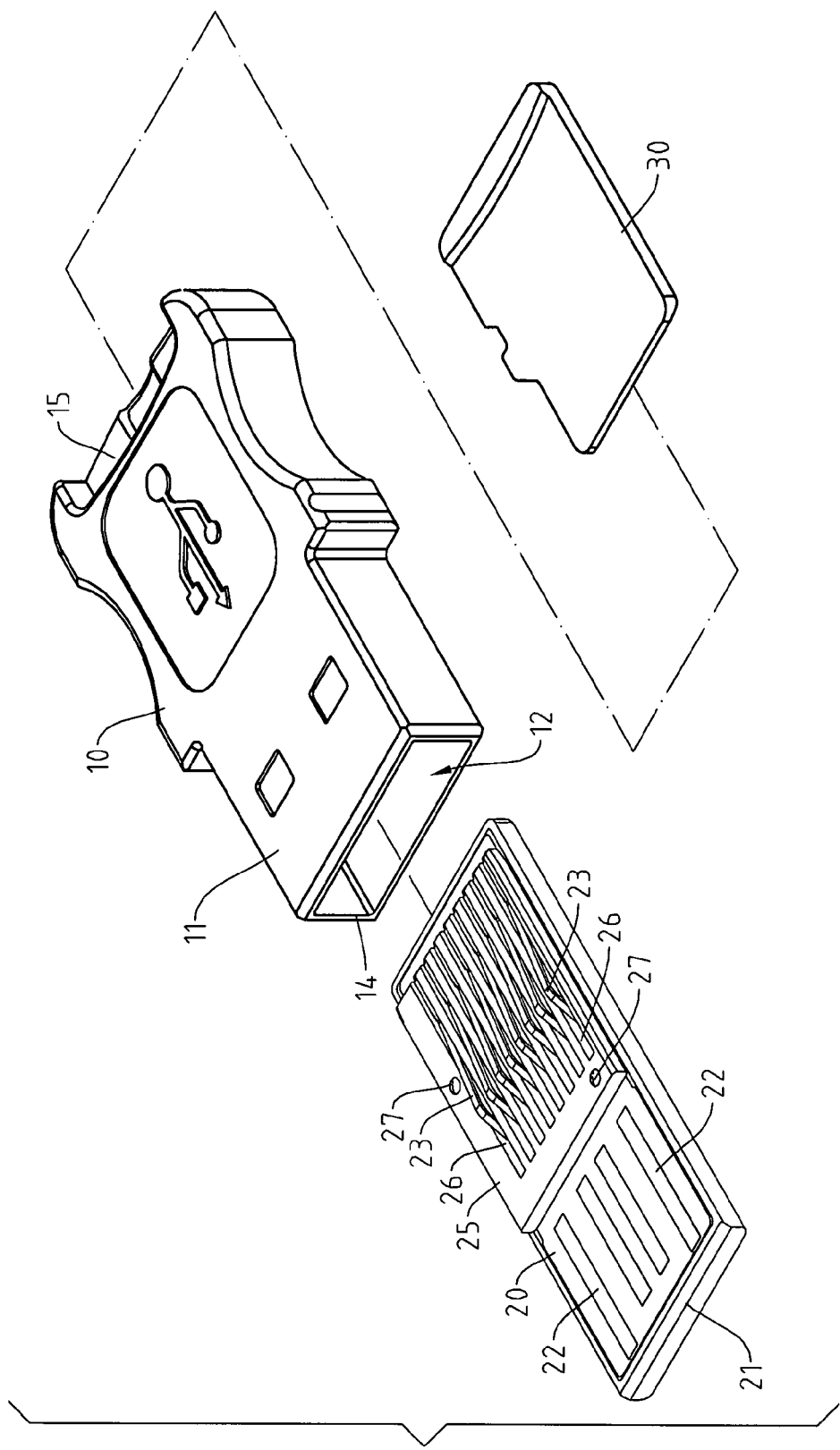
FIG. 2 is an exploded top perspective view of the memory card and the memory card reader in FIG. 1.
Figure 3:
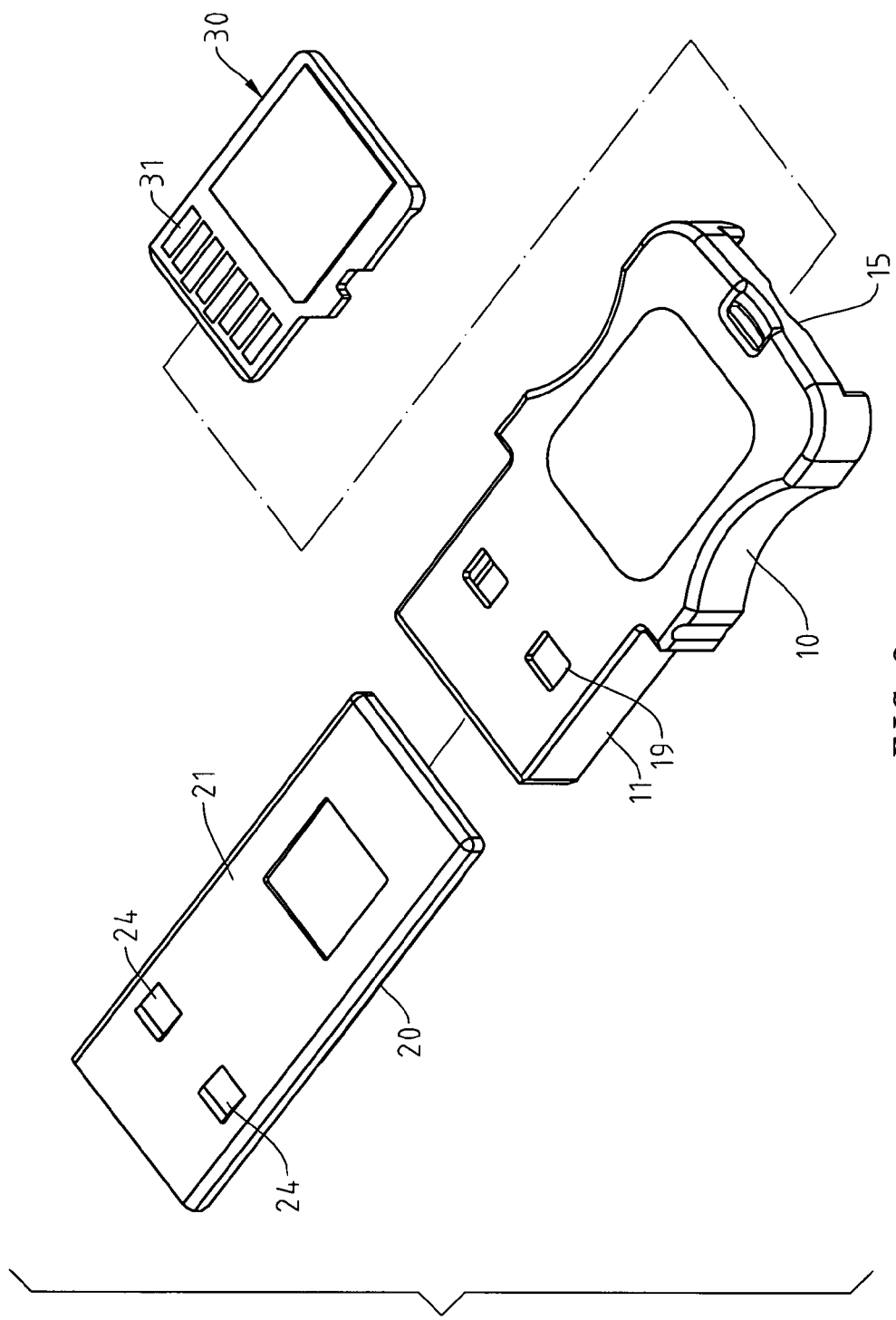
FIG. 3 is an exploded bottom perspective view of the memory card and the memory card reader in FIG. 1.
Figure 9:
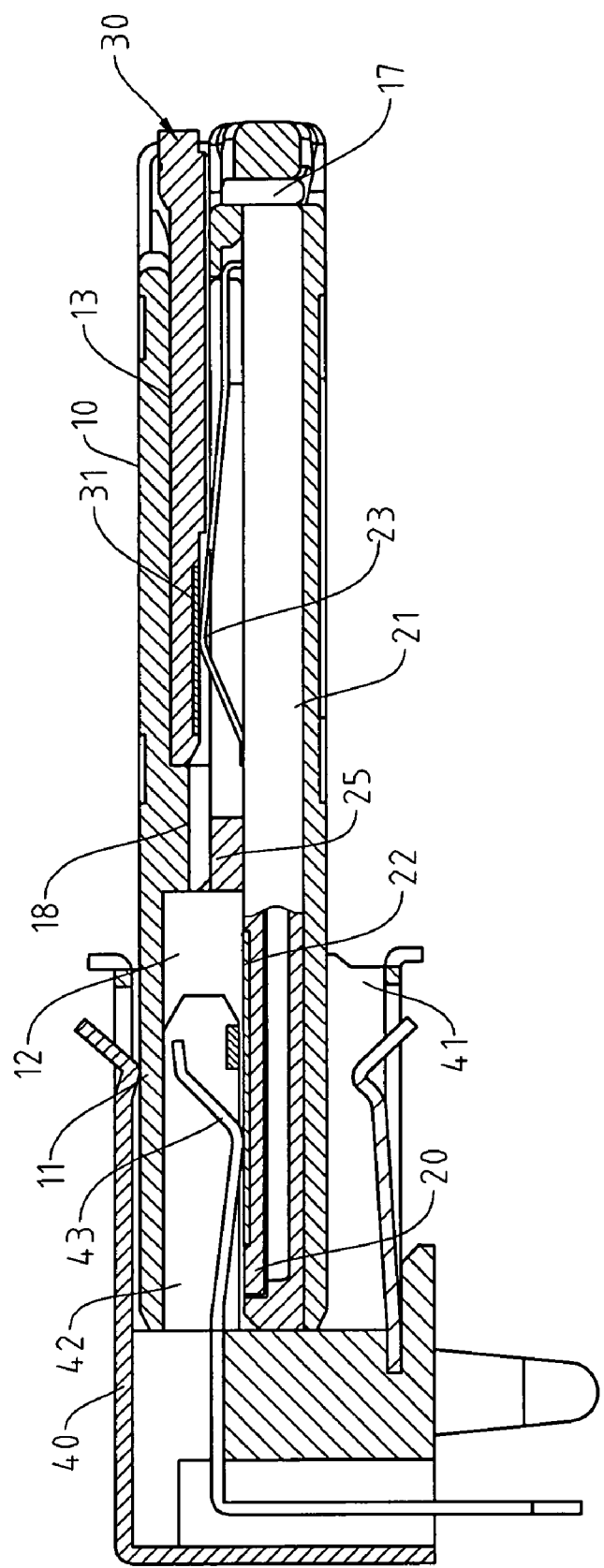
FIG. 9 is a sectional view similar to FIG. 8, illustrating use of the memory card reader in accordance with the present invention.

Referring initially to FIGS. 1 through 3, a memory card reader in accordance with the present invention includes a case 10 and an adaptor circuit board 20. An end of the memory card reader can be coupled with a USB socket 40 (see FIG. 9) of an electronic device such as a computer. A memory card 30 such as a Micro SD can be coupled with the other end of the memory card reader to allow read/write operations of the memory card 30.

In the example illustrated in FIGS. 4 through 8, the case 10 is substantially a hollow parallelepiped including a hollow coupler 11 on an end thereof. The coupler 11 has a compartment 12 with a coupling opening 14. The other end of the case 10 includes a card receiving space 13 with an insertion opening 15 allowing the memory card 30 to be inserted into the card receiving space 13. The card receiving space 13 is in communication with the compartment 12.

With reference to FIGS. 1 through 4, the adaptor circuit board 20 is mounted horizontally in a lower portion of the compartment 12 and a lower portion of the card receiving space 13 of the case 10. The adaptor circuit board 20 includes a USB interface 22 on an end of a side thereof, and a row of resilient conductive plates 23 are provided on the other end of the side of the adaptor circuit board 20. A plurality of electronic elements such as integrated circuits and an oscillator are mounted on the other side of the adaptor circuit board 20 and housed by a housing 21.

The USB interface 22 of the adaptor circuit board 20 faces the compartment 12 of the coupler 11. When the coupler 11 is coupled with a coupling seat 42 in the coupling opening 41 of a USB socket 40 (see FIG. 9), the USB interface 22 of the adaptor circuit board 20 is engaged with the coupling seat 42 and in reliable contact with resilient conductive plates 43 in the coupling seat 42.

The resilient conductive plates 23 of the adaptor circuit board 20 face the card receiving space 13. When the memory card 30 is inserted into and, thus, securely positioned in the card receiving space 13, a read/write interface 31 of the memory card 30 is in reliable contact with the resilient conductive plates 23. Hence, read/write operations of the memory card 30 can be performed through connection between the adaptor circuit board 20 (and its USB interface 22) and the USB socket 40.

Figure 4:
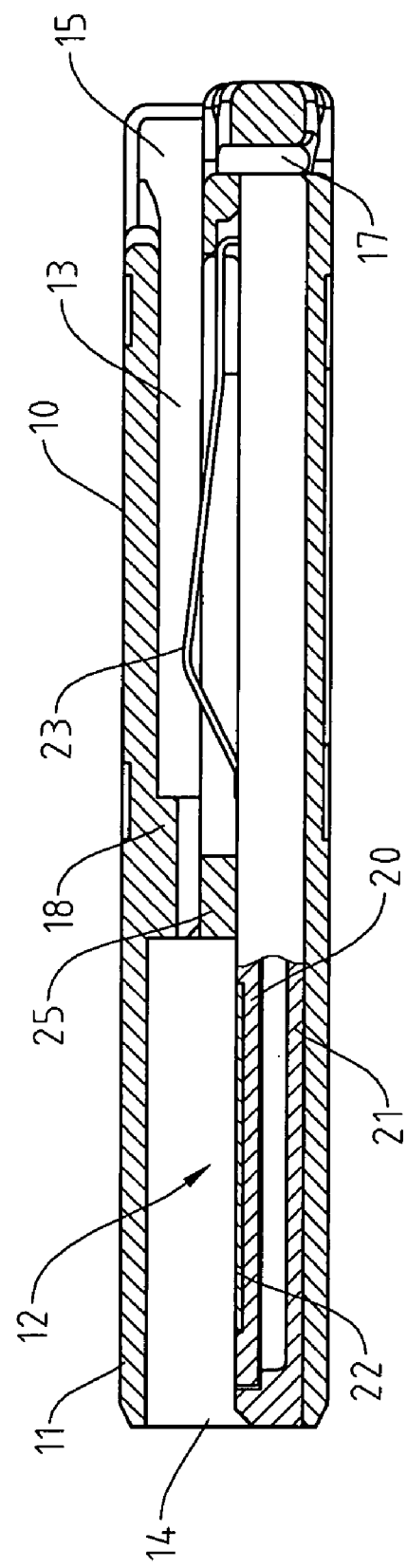
FIG. 4 is a sectional view of the memory card reader in accordance with the present invention.
Figure 5:
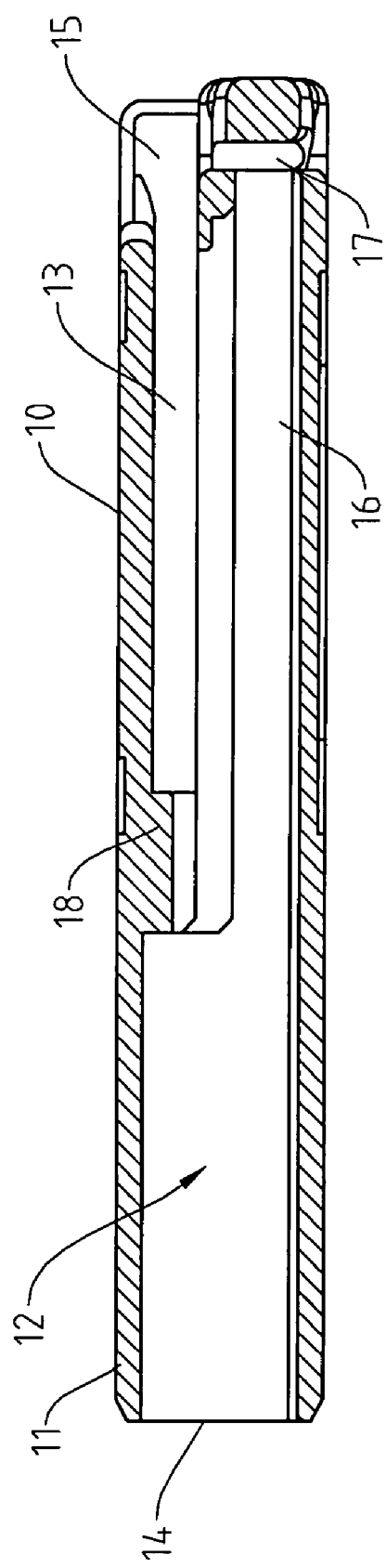
FIG. 5 is a sectional view similar to FIG. 4, wherein an adaptor circuit board is removed.
Figure 6:
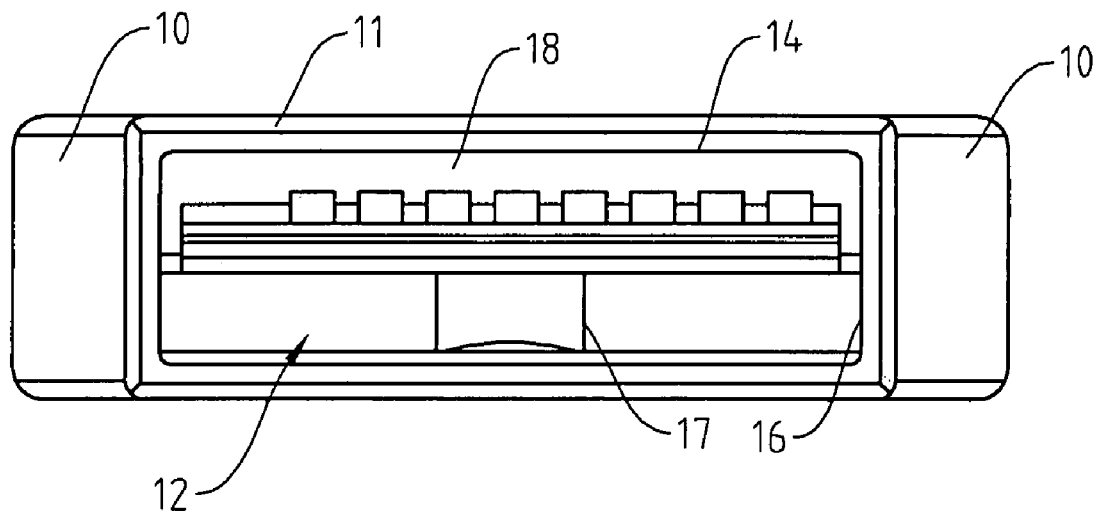
FIG. 6 is a front view of a case of the memory card reader in accordance with the present invention.
Figure 7:
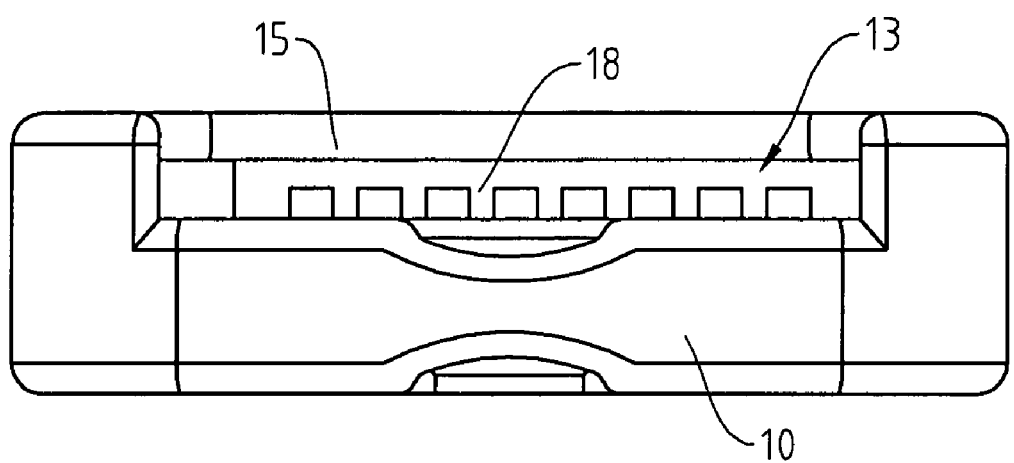
FIG. 7 is a rear view of the case in FIG. 6.
Figure 8:
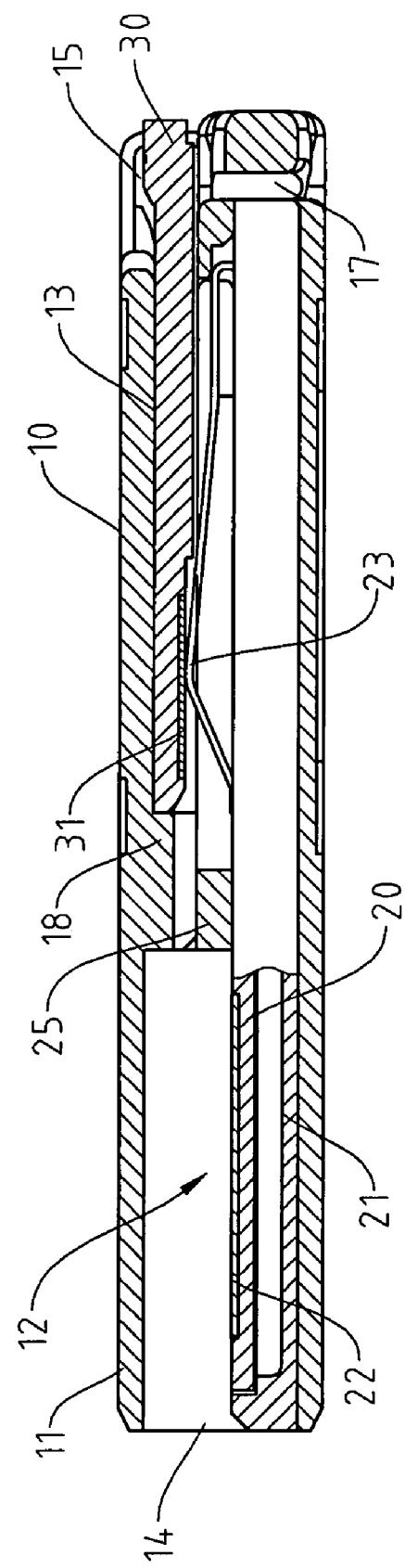
FIG. 8 is a sectional view of the memory card and the memory card reader in FIG. 1.

In the example illustrated in FIGS. 4 and 5, the case 10 is made of insulating plastic, with the coupler 11 integrally extending outward from the case 10, and with the coupling opening 14 defined in an end of the coupler 11. The compartment 12 has an extension groove 16 extending into the lower portion of the card receiving space 13, with the case 10 including a stepped portion 17 defining an end of the extension groove 16. The adaptor circuit board 20 is inserted into the compartment 12 and the extension groove 16. The case 10 further includes a stop wall 18 between the compartment 12 and the card receiving space 13. An inner end of the memory card 30 abuts against and is, thus, retained in place by the stop wall 18 when the memory card 30 is inserted into the card receiving space 13.

The adaptor circuit board 20 is removably mounted in the case 10. In the example illustrated in FIG. 3, two positioning protrusions 24 are formed on the adaptor circuit board 20 and two positioning holes 19 are defined in the case 10 for engaging with the positioning protrusions 24. In an alternative example, the positioning protrusions 24 are formed on the case 10 and the positioning holes 19 are defined in the adaptor circuit board 20. An insulating board 25 (see FIG. 2) is fixed by fasteners 27 (such as rivets) to the other end of the adaptor circuit board 20. The insulating board 25 includes a plurality of spaced slots 26 through which the resilient conductive plates 23 extend beyond the adaptor circuit board 20. The resilient conductive plates 23 are isolated from one another to avoid undesired contact.

The memory card reader in accordance with the present invention including a case 10 and an adaptor circuit board 20 allows reliable coupling with the USB socket and receives a memory card 30 without the risk of unreliable contact. Manufacturing of the memory card reader can be easily accomplished at low costs.

Although a specific embodiment has been illustrated and described, numerous modifications and variations are still possible without departing from the essence of the invention. The scope of the invention is limited by the accompanying claims.

What is claimed is:

1. A memory card reader comprising:
   a case including a first end having a coupler with a compartment, with the first end of the case being adapted to couple with a coupling opening of a USB socket, with the case further including a second end having a card receiving space in communication with the compartment, with the card receiving space including an insertion opening and being adapted for receiving a memory card through the insertion opening; and
   an adaptor circuit board mounted in the compartment and the card receiving space, with the adaptor circuit board including a side having a first end with a USB interface and a second end with a plurality of resilient conductive plates,
   with the USB interface of the adaptor circuit board facing the compartment of the coupler and being adapted for engaging with a coupling seat in the coupling opening of the USB socket and adapted to be in contact with a plurality of resilient conductive plates in the coupling seat,
   with the resilient conductive plates of the adaptor circuit board facing the card receiving space and being adapted to be in contact with a read/write interface of the memory card, and
   with the case being made of insulating plastic, with the coupler integrally extending outward from the case, with a coupling opening being defined in an end of the coupler, with the compartment including an extension groove extending into a lower portion of the card receiving space, with the case including a stepped portion defining an end of the extension groove, and with the adaptor circuit board being mounted in the compartment and the extension groove.

2. The memory card reader as claimed in claim 1, with the case further including a stop wall between the compartment and the card receiving space, and with an inner end of the memory card abutting against and being retained in place by the stop wall when the memory card is inserted into the card receiving space.

3. The memory card reader as claimed in claim 1, with the adaptor circuit board including a housing on an end thereof, with one of the housing and the case including at least one positioning protrusion, and with the other one of the housing and the case including at least one positioning hole for engaging with the positioning protrusion.

4. A memory card reader comprising:
   a case including a first end having a coupler with a compartment, with the first end of the case being adapted to couple with a coupling opening of a USB socket, with the case further including a second end having a card receiving space in communication with the compartment, with the card receiving space including an insertion opening and being adapted for receiving a memory card through the insertion opening; and
   an adaptor circuit board mounted in the compartment and the card receiving space, with the adaptor circuit board including a side having a first end with a USB interface and a second end with a plurality of resilient conductive plates,
   with the USB interface of the adaptor circuit board facing the compartment of the coupler and being adapted for engaging with a coupling seat in the coupling opening of the USB socket and adapted to be in contact with a plurality of resilient conductive plates in the coupling seat,
   with the resilient conductive plates of the adaptor circuit board facing the card receiving space and being adapted to be in contact with a read/write interface of the memory card, and
   with the adaptor circuit board further including an insulating board on a side thereof, and with the insulating board isolating the resilient conductive plates from one another while allowing the resilient conductive plates to extend beyond the adaptor circuit board.

5. The memory card reader as claimed in claim 1, with the adaptor circuit board further including an insulating board on a side thereof, and with the insulating board isolating the resilient conductive plates from one another while allowing the resilient conductive plates to extend beyond the adaptor circuit board.

* * * * *